US012740344B2

(12) United States Patent
Mizutani et al.

(10) Patent No.: US 12,740,344 B2
(45) Date of Patent: Sep. 15, 2026

(54) METHOD FOR MANUFACTURING CRYSTALLINE GALLIUM NITRIDE THIN FILM

(71) Applicant: KOJUNDO CHEMICAL LABORATORY CO., LTD., Sakado (JP)

(72) Inventors: Fumikazu Mizutani, Sakado (JP); Shintaro Higashi, Sakado (JP); Nobutaka Takahashi, Sakado (JP)

(73) Assignee: KOJUNDO CHEMICAL LABORATORY CO., LTD., Sakado (JP)

( * ) Notice: Subject to any disclaimer, the term of this patent is extended or adjusted under 35 U.S.C. 154(b) by 12 days.

(21) Appl. No.: 17/919,883

(22) PCT Filed: May 14, 2021

(86) PCT No.: PCT/JP2021/018432

§ 371 (c)(1),
(2) Date: Oct. 19, 2022

(87) PCT Pub. No.: WO2021/241281

PCT Pub. Date: Dec. 2, 2021

(65) Prior Publication Data

US 2023/0160051 A1 May 25, 2023

(30) Foreign Application Priority Data

May 26, 2020 (JP) ................................ 2020-091235
May 10, 2021 (JP) ................................ 2021-079631

(51) Int. Cl.

| | |
|---|---|
| ***H10P 14/24*** | (2026.01) |
| ***C23C 16/02*** | (2006.01) |
| ***C23C 16/40*** | (2006.01) |
| ***C23C 16/455*** | (2006.01) |
| *C07F 17/00* | (2006.01) |

(52) U.S. Cl.

CPC .......... *H10P 14/24* (2026.01); *C23C 16/0272* (2013.01); *C23C 16/40* (2013.01); *C23C 16/45553* (2013.01); *C07F 17/00* (2013.01)

(58) Field of Classification Search

CPC ................ C23C 16/0272; C23C 16/40; C23C 16/45553

See application file for complete search history.

(56) References Cited

U.S. PATENT DOCUMENTS

| | | | | |
|---|---|---|---|---|
| 8,846,502 B2 | 9/2014 | Haukka et al. | | |
| 2001/0000866 A1* | 5/2001 | Sneh | H01L 21/02178 | 118/723 R |
| 2006/0174815 A1* | 8/2006 | Butcher | C30B 25/105 | 117/2 |
| 2006/0216548 A1* | 9/2006 | Mao | C23C 28/00 | 257/E21.28 |
| 2011/0060165 A1* | 3/2011 | Cameron | C07F 17/00 | 427/255.394 |
| 2012/0034149 A1 | 2/2012 | Fujiwara et al. | | |
| 2013/0012003 A1* | 1/2013 | Haukka | H01L 21/0262 | 257/E21.108 |
| 2017/0186754 A1* | 6/2017 | Blomberg | H10B 43/27 | |
| 2019/0203357 A1 | 7/2019 | Mizutani et al. | | |
| 2020/0161475 A1* | 5/2020 | Cho | H10D 86/423 | |
| 2021/0013366 A1 | 1/2021 | Sakai et al. | | |

FOREIGN PATENT DOCUMENTS

| | | | |
|---|---|---|---|
| EP | 2492273 | A1 | 8/2012 |
| JP | 2016-533645 | A | 10/2016 |
| JP | 2018-528615 | A | 9/2018 |
| JP | 2019-056133 | * | 4/2019 |
| JP | 2019-56133 | A | 4/2019 |
| KR | 10-2013-0109946 | A | 10/2013 |
| WO | 2015/042199 | A1 | 3/2015 |
| WO | 2017/044690 | A1 | 3/2017 |
| WO | 2019/187737 | A1 | 10/2019 |

OTHER PUBLICATIONS

Bannerjee et al. “Thermal Atomic Layer Deposition of Polycrystalline Galliun Nitride”. Journal of Physical Chemistry (2019). vol. 123, pp. 23214-23225 (Year: 2019).*

Ozgit-Akgun et al. Hollow cathode plasma-assisted atomic layer deposition of crystalline AlN, GaN and AlxGa1-xN thin films at low temperatures. Journal of Material Chemistry C (2014), vol. 2, p. 2123 (Year: 2014).*

Khan et al., “Atomic layer epitaxy of GaN over sapphire using switched metalorganic chemical vapor deposition”, Appl. Phys. Lett., 1992, vol. 60, No. 11, pp. 1366-1368, cited in Specification (4 pages).

Sprenger et al., “Electron Enhanced Growth of Crystalline Gallium Nitride Thin Films at Room Temperature and 100° C. Using Sequential Surface Reactions”, Chem. Mater., 2016, vol. 28, No. 15, pp. 5282-5294, cited in Specification and ISR (13 pages).

Ozgit-Akgun et al., “Hollow cathode plasma-assisted atomic layer deposition of crystalline AlN, GaN and AlxGa1-xN thin films at low temperatures”, J. Mater. Chem. C, 2014, vol. 2, pp. 2123-2136, cited in Specification (15 pages).

Liu et al., “PEALD-deposited crystalline GaN films on Si (100) substrates with sharp interfaces”, Chin. Phys. B, 2019, vol. 28, No. 2, pp. 026801-1-026801-7, cited in Specification (7 pages).

(Continued)

*Primary Examiner* — Jose I Hernandez-Kenney
(74) *Attorney, Agent, or Firm* — WHDA, LLP

(57) ABSTRACT

Provided is a more efficient method of manufacturing a GaN film by the atomic layer deposition (ALD), wherein a high crystalline GaN film containing very few impurities is manufactured using a monovalent gallium compound without high-temperature thermal treatment such as laser annealing. The method of manufacturing a crystalline gallium nitride thin film by the ALD comprises a step 1 of feeding a monovalent organogallium complex into a reaction chamber where a substrate temperature is 350° C. or less, and a step 2 of feeding a nitriding gas into the reaction chamber.

6 Claims, 1 Drawing Sheet

(56) References Cited

OTHER PUBLICATIONS

Wen-Hui et al., "Low temperature depositions of GaN thin films by plasma-enhanced atomic layer deposition", Acta Phys. Sin., 2017, vol. 66, No. 9, pp. 098101-1-098101-6, cited in Specification, w/English abstract (6 pages).
Jutzi et al., "A novel synthetic route to pentaalkylcyclopentadienylgallium (I) compounds", J. Organomet. Chem., 2002, vol. 654, pp. 176-179, cited in Specification (4 pages).
International Search Report dated Jul. 6, 2021, issued in counterpart International Application No. PCT/JP2021/018432 (3 pages).
Office Action dated Mar. 20, 2024, issued in KR Application No. 10-2022-7037542. (6 pages).
Office Action dated Mar. 14, 2025, issued in counterpart KR Application No. 10-2022-7037542, with English translation. (14 pages).

* cited by examiner

METHOD FOR MANUFACTURING CRYSTALLINE GALLIUM NITRIDE THIN FILM

TECHNICAL FIELD

The present invention relates to a method of forming a crystalline gallium nitride thin film by an atomic layer deposition (ALD) method.

BACKGROUND ART

Gallium nitride (GaN) is an important semiconductor material used for emitting blue to bluish purple light from a light emitting diode (LED) and blue laser. It is very desirable to grow GaN single crystal layer on a silicon substrate, but because the crystal lattice spacing of GaN does not fit that of silicon, crystalline GaN is carried out to grow epitaxially on a sapphire substrate which has a lattice constant close to that of GaN. However, a single crystal sapphire substrate ordinally costs a lot of money compared to a silicon substrate. Therefore the technique for growing a high crystalline GaN film on such inexpensive and general-purpose substrates as the silicon substrate is expected.

In general, chemical vapor deposition (CVD) methods are used for the formation of GaN films. In the atomic layer deposition (ALD) method which is one of the CVD methods, precursors are not deposited successively but by a layer-by-layer, so that a ultrathin film of a few nanometers can be deposited under highly accurate control.

Thus methods of forming a crystalline GaN film using the ALD have been investigated. For example, there is a report about a method of forming a single crystal GaN thin film on a sapphire substrate, using hydrogen as a carrier gas, triethylgallium (TEG), and ammonia at 450 to 900° C. (NPL 1). Sapphire is appropriate for epitaxial growth of GaN, because it is heat resistant enough to withstand a high temperature of 450 to 900° C.

According to PTL 1, a method of forming a GaN-ALD film includes forming a GaN device layer on a silicon substrate to which aluminum nitride (AlN) for a nucleation layer was applied, and then crystalizing GaN by laser annealing.

Another method for crystallization besides by laser annealing is following; trimethylgallium (TMG), hydrogen radicals and ammonia are introduced in this order and when the ALD is carried out at 100° C., electron beam is irradiated to eliminate hydrogen to form a crystalline GaN film after the introduction of hydrogen radicals and also after the introduction of ammonia (NPL 2). However, a GaN film obtained by this method has a lot of carbon impurities, which are 10 to 35 at %.

In an example of crystallization using plasma disclosed in NPL 3, a crystalline thin film is formed using TMG, ammonia plasma, and nitrogen-hydrogen mixed gas plasma (hereinafter referred to as "nitrogen/hydrogen plasma") or nitrogen plasma at 200° C. However, as the N/Ga ratio of the crystalline thin film is significantly rich in nitrogen, the film is inferior in quality when the nitrogen plasma is used without hydrogen. In NPL 4, a crystalline GaN thin film is formed using TEG and nitrogen/hydrogen plasma at 200° C., 285° C. and 350° C. When formed on the Si (001) plane, the above mentioned crystalline thin film has an amorphous interface layer with a thickness of approximately 18 nm grown on a silicon substrate. Both films are very nitrogen-rich in N/Ga ratio. In NPL 5, a crystalline film is formed by the ALD using TMG and nitrogen-hydrogen mixed gas plasma at 250° C.

According to NPL 5, a film cannot be formed by the ALD at less than 210° C., even if plasma is used. An ALD film obtained at 250° C. has a N/Ga ratio slightly rich in Ga, but has approximately 9% carbon impurities. Crystallization using plasma is also exemplified in PTL 2. According to PTL 2, a GaN thin film is formed using TMG or TEG and using nitrogen/hydrogen plasma. PTL 2 also exemplifies gallium halides, such as $GaCl_3$, GaCl and $GaI_3$.

CITATION LIST

Patent Literature

PTL 1: Japanese Unexamined Patent Application Publication (Translation of PCT application) No. 2016-533645
PTL 2: U.S. Pat. No. 8,846,502

Non-Patent Literature

NPL 1: 'Atomic layer epitaxy of GaN over sapphire using switched metal organic chemical vapor deposition', M. Asif Khan et al., Appl. Phys. Lett. 60, 1366 (1992)
NPL 2: 'Electron enhanced growth of crystalline gallium nitride thin films at room temperature and 100° C. using sequential surface reactions', Jaclyn K. Sprenger et al., Chem. Mater. 2016, 28, 15, 5282-5294
NPL 3: 'Hollow cathode plasma-assisted atomic layer deposition of crystalline AlN, GaN and $Al_xGa_{1-x}N$ thin films at low temperatures', Cagla Ozgit-Akgun et al., J. Mater. Chem. C, 2014, 2, 2123
NPL 4: 'PEALD-deposited crystalline GaN films on Si(100) substrates with sharp interfaces', San-Jie Liu et al., Chin. Phys. B Vol. 28, No. 2 (2019) 026801
NPL 5: 'Low temperature depositions of GaN thin films by plasma-enhanced atomic layer deposition', Tang Wen-Hui et al., Acta Physica Sinica, 66, 098101 (2017)

SUMMARY OF INVENTION

Technical Problem

TMG and TEG are widely used as a Ga source to form a GaN film by the ALD method. But they are very unstable in air and ignite spontaneously, so that they are not easy to handle. In order to form a high crystalline GaN thin film, it is necessary to carry out the ALD at high temperature, or to carry it out in combination with the high-temperature thermal treatment and the annealing techniques such as laser or electron beam irradiation simultaneously with or immediately after the ALD.

A GaN film formed on the substrate is a monovalent gallium compound. When trivalent gallium complexes such as TMG and TEG are used as a precursor, gallium needs to be reduced, which may be contaminated with carbon and may cause poor crystallization of the resulting GaN film. But even if it is a monovalent gallium complex, an inorganic gallium complex may contaminate GaN with inorganic elements. The object of the present invention is therefore to provide a more effective way of manufacturing a GaN film by the ALD, that is to say, a method of manufacturing a high crystalline GaN thin film with very few impurities.

In order to enhance the crystallinity of GaN thin films, substrates such as GaN, sapphire and AlN which have lattice constants close to that of GaN, have been used so far. The present invention is also intended to produce GaN with high crystallinity even on a substrate which does not contain any of nitrogen, gallium and aluminum, namely constituent elements of GaN and sapphire, as a main component.

The method of manufacturing a crystalline gallium nitride thin film by the atomic layer deposition (ALD) method of the present invention comprises a step 1 of feeding a monovalent organogallium complex into a reaction chamber where a substrate temperature is 350° C. or less, and a step 2 of feeding a nitriding gas into the reaction chamber.

Preferably, the nitriding gas is nitrogen plasma gas.

Preferably, the organogallium complex is a cyclopentadienyl complex.

The method preferably further comprises a step 3 of feeding an oxygen-free reducing gas between the steps 1 and 2.

In a preferred embodiment of the present invention, the surface of the substrate contains none of nitrogen, gallium and aluminum as a main component.

Prior to the step 1, the method preferably comprises a step of depositing 5 nm or less-thick gallium oxide using the foregoing precursor and an oxidant as the pretreatment of a substrate.

Advantageous Effects of Invention

In the present invention, a high crystalline GaN film can be produced from an organogallium complex by the ALD method without any high-temperature thermal treatment, such as laser annealing.

DESCRIPTION OF EMBODIMENTS

Figure 1:
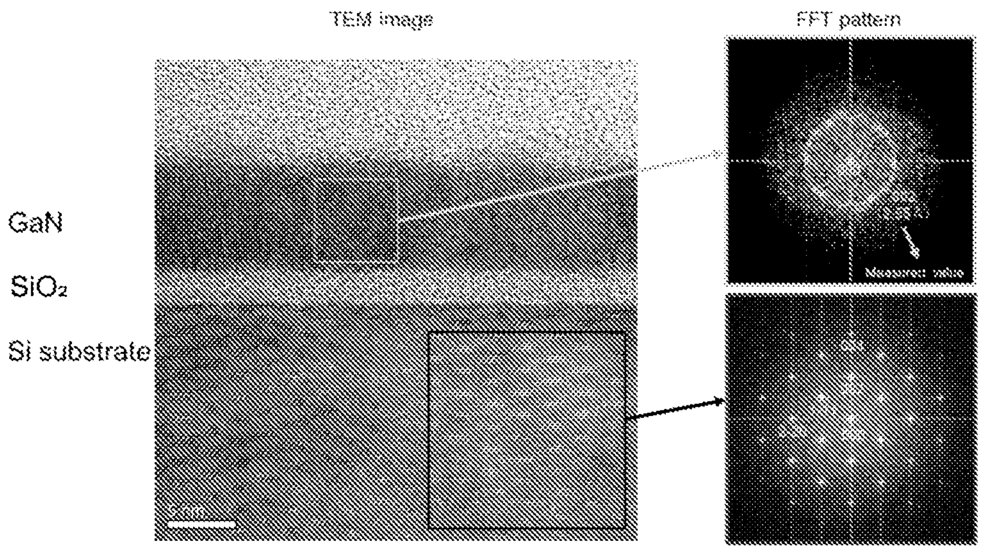
FIG. 1 represents a cross-sectional TEM image of a GaN film of Example 1 formed on a silicon wafer with natural oxide.

Hereinafter, the present invention will be described in detail.

The method of manufacturing a gallium nitride (GaN) thin film of the present invention comprises the step 1 of feeding a monovalent organogallium complex to a reaction chamber where a substrate temperature is 350° C. or less and the step 2 of feeding a nitriding gas to the reaction chamber by use of the ALD.

There are two types of ALDs. One is thermal ALD and the other is plasma enhanced ALD (PEALD). In the thermal ALD, a uniform film can be formed along a surface with high aspect ratio, while the PEALD can be carried out at lower temperature. There are some cases where the film-forming ability on the surface with high aspect ratio of the PEALD is inferior to that of the thermal ALD, though. Both methods are usable in the present invention, but the PEALD would be more suitable because the present invention aims to provide a high crystalline GaN film efficiently using a monovalent gallium chemical species.

In the PEALD, which is a preferred embodiment of the present invention, a GaN film is formed by the following deposition cycles of (i) to (iii). One embodiment of the deposition cycle includes (i) a step of feeding a vapor phase precursor into a reaction chamber so that the precursor can be adsorbed on the surface of the substrate, and (ii) a step of feeding a nitriding gas from which radical species are generated by plasma into the reaction chamber and then reacting it with the precursor adsorbed on the surface to form a GaN crystalline layer. Each cycle is repeated until deposition of the film reaches a desired thickness.

In the (i) described above, a monovalent organogallium complex in a vapor phase is fed into a reaction chamber with a substrate installed (step 1). The temperature of the substrate is arbitrarily set in a range from room temperature to 350° C. The monovalent organogallium complex is evaporated at lower temperature than the substrate temperature so as not to condense on the substrate.

In the (ii), a nitriding gas is fed into a reaction chamber (step 2). The nitriding gas reacts with the precursor adsorbed on the surface of the substrate and grows a crystalline GaN thin film on the substrate. The GaN thin film can be polycrystalline, but is preferably a single crystal. When the GaN thin film is a single crystal, the film has a N/Ga ratio of 1. When the GaN thin film is polycrystalline, a dense film being Ga rich, i.e., a N/Ga ratio of 1 or less is preferable. The GaN thin film above mentioned has little polycrystalline portion. Preferably, the polycrystalline portion is less than 1 vol %. Less than 0.01 vol % is more preferable, and less than 0.0001 vol % is particularly preferable. The GaN thin film is a high-purity thin film. Preferably, the amount of carbon impurities is 5 atom % or less, 1 atom % or less is more preferable, 0.01 atom % or less is further preferable, and 0.001 atom % or less is particularly preferable. Similarly, preferably, the amount of oxygen impurities is 5 atom % or less, 1 atom % or less is more preferable, 0.01 atom % or less is further preferable, and 0.001 atom % or less is particularly preferable.

The nitriding gas fed in the step 2 is a gas containing nitrogen, and a nitriding gas from which radical species are generated by plasma is preferable. The nitriding gas should be ideally free from carbon, though no particular restriction is imposed on as far as it can generate nitrogen radical. Ammonia/hydrogen plasma gas and nitrogen plasma gas are more preferable, and nitrogen plasma gas is particularly preferable because it is easy to use. The "ammonia/hydrogen plasma gas" refers to ammonia-hydrogen mixed gas plasma.

Here, the precursor of the present invention is a monovalent organogallium complex. When the monovalent organogallium complex is inorganic complexes, such as gallium chloride (I) and gallium bromide (I), contamination and corrosion may considered unfavorable. For example, GaCl may corrode the substrate and chamber due to Cl contamination and byproducts.

Monovalent organogallium complexes include a cyclopentadienyl complex represented by the following general formula (1).

(1)

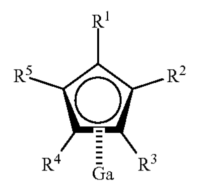

In the general formula (1), $R^1$ to $R^5$ each independently represent a hydrogen atom or an alkyl group having 1 to 4 carbon atoms.

In the general formula (1), it is preferable that four of $R^1$ to $R^5$ should be methyl group and the remaining one is methyl group, ethyl group, n-propyl group or isopropyl group. A specific example of the precursor represented by the general formula (1) is ($\eta^5$-pentamethylcyclopentadienyl) gallium (I) (hereinafter also referred to as "Cp*Ga" or "Ga($C_5$ $(CH_3)_5$)") represented by the following structural formula, which is particularly preferable.

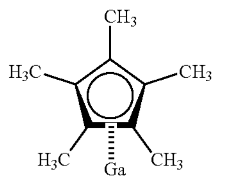

The substrate to grow GaN includes a silicon substrate, a sapphire substrate, a carbon silicate substrate and a GaN substrate. Needless to say, among these substrates, the GaN substrate made of the same material is suitable for the purpose of forming a GaN film with high crystallinity, but the sapphire substrate having a lattice constant close to that of GaN is also suitable.

In the present invention, a substrate containing none of nitrogen, gallium and aluminum as a main component can be used to form a GaN film with high crystallinity. A silicon substrate is appropriate for such a substrate. The silicon substrate can be spontaneously oxidized in the atmosphere and have the surface coated with a very thin silicon dioxide film.

It is also preferable that a very thin film of gallium oxide should be formed on the substrate for the pretreatment to form a GaN film. A gallium oxide thin film preferably has a thickness of 5 nm or less, more preferably 2 nm or less, and particularly preferably 1.5 nm or less in order not to exert bad influence on the characteristics of the GaN film. A preferable method to form the gallium oxide thin film is the atomic layer deposition method. Besides, the same precursor as used in the present invention should be used, because the film can be continuously deposited. If only a gallium oxide thin film can be formed, any oxidant, such as water, oxygen, ozone, oxygen plasma or a combination thereof can be used arbitrarily. The gallium oxide thin film may be amorphous or crystalline, and is preferably amorphous because of its easy formability. The gallium oxide thin film may be composed of 1 to 5 atomic layers or a monoatomic layer.

The ALD should be carried out at a temperature lower than the thermal decomposition temperature of a monovalent organogallium complex adsorbed on the substrate, and should be carried out at a temperature where the monovalent organogallium complex is fully reactive to the nitriding gas. Preferably, the temperature is 50 to 350° C., and more preferably, 150 to 250° C. When pentamethylcyclopentadienylgallium (Cp*Ga or $GaC_5(CH_3)_5$) is used as a precursor, a temperature of 200° C. at which Cp*Ga does not thermally decompose is preferable. The substrate temperature and the reaction temperature should be the same.

The step 3 of feeding an oxygen-free reducing gas may be inserted between the steps 1 and 2. The reducing gas serves to eliminate a counter ion of Ga and cyclopentadienyl group from the monovalent organogallium complex adsorbed on the substrate. Concretely, after the monovalent organogallium complex as a precursor is fed and adsorbed on the substrate, the reducing gas is served to eliminate the ligand therefrom before the nitriding gas is fed to react with the precursor.

Ammonia and/or hydrogen are preferably used as the reducing gas. And a gas obtained by adding nitrogen and/or inert gases (e.g., argon) to the reducing gas in an appropriate proportion can be used as well. It is also preferable to generate radical species by plasma of these gases.

Ordinarily, after the steps 1, 2 and 3, inert gases such as nitrogen and argon are introduced in order to purge unreacted precursors and byproducts from reaction space.

In a preferred embodiment of the method of manufacturing the crystalline gallium nitride thin film of the present invention, the film is formed in the deposition cycle order of precursors such as Cp*Ga, ammonia/hydrogen plasma gas, and nitrogen plasma gas. When the precursor is irradiated with ammonia/hydrogen plasma gas, the precursor adsorbed on the substrate reacts with ammonia/hydrogen plasma gas and a ligand is eliminated from the precursor. Next, hydrogen of NH group and $NH_2$ group remaining on the film formed on the substrate is eliminated by irradiation of nitrogen plasma, which enables a crystalline GaN thin film to be formed. In the nitriding reaction, plasma is generated by exciting, dissociating and ionizing a nitriding gas with electric power (for example 400 W), while the nitrogen-containing gas with 0.1 to 1000 mTorr is being introduced under vacuum. The degree of electric power is not restricted, provided that plasma is generated. The electric power may be applied directly near the substrate or a little away from the substrate to generate plasma.

As described above, according to the ALD method of the present invention, a high crystalline GaN film can be produced from a monovalent organogallium complex without any high-temperature thermal treatment, such as laser annealing.

EXAMPLES

Hereinafter, the present invention is described in more detail with reference to Examples. However, the present invention is not restricted thereto.

Example 1

(1) Preparation of Cp*Ga

Cp*Ga (pentamethylcyclopentadienylgallium) was synthesized in accordance with P. Jutzi et al., J. Organomet. Chem. 654, 176 (2002).

Differential scanning calorimetry (DSC) confirmed an exothermic peak due to the decomposition of Cp*Ga at 250° C.

(2) Formation of a GaN Film by the ALD

A silicon wafer with natural oxide was placed in an ALD system (FlexAL; manufactured by Oxford Instruments). The ALD film formation was carried out using Cp*Ga as a precursor, and using ammonia/hydrogen plasma gas and nitrogen plasma gas as a reducing gas and a nitriding gas, respectively. The temperature to vaporize Cp*Ga outside the reaction chamber was set at 80° C. and the temperature of the substrate at 200° C.

In short, the ALD film formation was carried out in the cycle order of Cp*Ga->ammonia/hydrogen plasma->nitrogen plasma to obtain a GaN film.

The cross-section observed by transmission electron microscopy (TEM) showed that a GaN film formed after 300 cycles of this method was crystallized. The result (XTEM image) is shown in FIG. 1.

Composition analysis of the GaN film portion of this sample using a high-resolution RBS analysis system (HRBS 500; manufactured by Kobe Steel, Ltd.) confirmed that C and O impurities were undetectable (C; approximately 4 atom %, O; approximately 3 atom %) and that the N/Ga ratio was 0.9.

As just described, the method of the present invention can produce a high crystalline GaN film with very few impurities.

Example 2

(1) Preparation of Cp*Ga

Cp*Ga was prepared in a manner similar to Example 1.

(2) Formation of a GaN Film by the ALD

A silicon wafer with natural oxide was placed in an ALD system (FlexAL; manufactured by Oxford Instruments). The ALD was carried out using Cp*Ga as a precursor, and water and oxygen plasma gas as oxidants in this order. Thus a 1.1 nm-thick gallium oxide thin film was formed on the silicon wafer with natural oxide. Next, the ALD film formation was carried out using Cp*Ga and using ammonia/hydrogen plasma gas and nitrogen plasma gas as a reducing gas and a nitriding gas, respectively. Cp*Ga was vaporized by Ar bubbling at a temperature of 40° C. outside the reaction chamber. The temperature of the substrate was 200° C.

Figure 2:
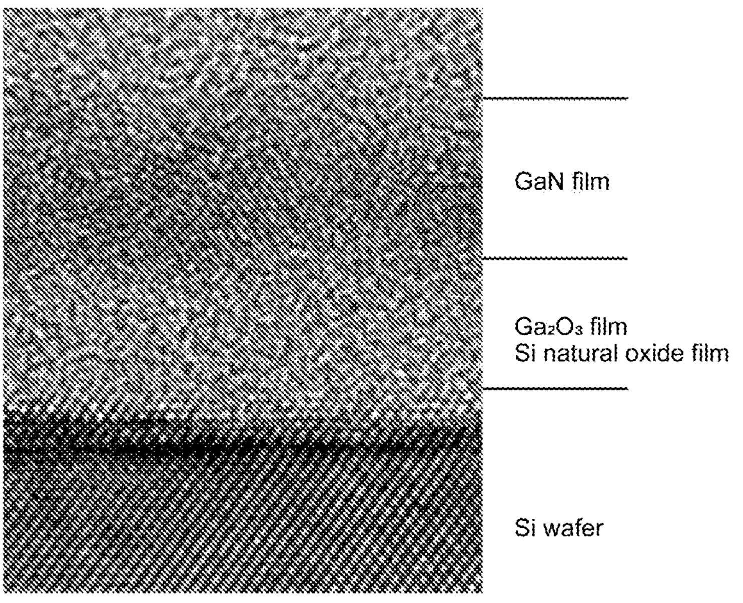
FIG. 2 represents a cross-sectional TEM image of a GaN film formed in Example 2.

In short, the ALD film formation was carried out in the cycle order of gallium oxide->Cp*Ga->ammonia/hydrogen plasma->nitrogen plasma to obtain a GaN film. The cross-section observed by transmission electron microscopy (TEM) showed that a GaN film formed after 500 cycles of this method was crystallized. The result (XTEM image) is shown in FIG. 2.

The invention claimed is:

1. A method of manufacturing a crystalline gallium nitride thin film having a carbon impurity content of 5 atomic % or less, an oxygen impurity content of 5 atomic % or less, and a N/Ga ratio of 1 or less, by the atomic layer deposition (ALD) method, in which substrate temperature is 350° C. or less, without any high-temperature thermal treatment by annealing with laser irradiation or electron beam irradiation, including a step 1 of feeding a monovalent organogallium complex into a reaction chamber to adsorb the monovalent organogallium complex onto a surface of a substrate where the substrate temperature is 350° C. or less, and a step 2 of, after the step 1, feeding a nitriding gas to the substrate at a temperature of 350° C. or less in the reaction chamber, and causing the monovalent organogallium complex adsorbed on the surface of the substrate in the step 1 to react with the nitriding gas to grow the crystalline gallium nitride thin film on the substrate.

2. The method of manufacturing a crystalline gallium nitride thin film according to claim 1, wherein the nitriding gas is nitrogen plasma gas.

3. The method of manufacturing a crystalline gallium nitride thin film according to claim 1, wherein the organogallium complex is a cyclopentadienyl complex.

4. The method of manufacturing a crystalline gallium nitride thin film according to claim 1, further including a step 3 of feeding an oxygen-free reducing gas between the steps 1 and 2.

5. The method of manufacturing a crystalline gallium nitride thin film according to claim 1, wherein the surface of the substrate contains none of nitrogen, gallium and aluminum as a main component.

6. The method of manufacturing a crystalline gallium nitride thin film according to claim 1 including a step of depositing 5 nm or less-thick gallium oxide using the monovalent organogallium complex and oxidants for a pretreatment of the substrate, prior to the step 1.

* * * * *